United States Patent
Mizuno

(10) Patent No.: US 8,860,053 B2
(45) Date of Patent: Oct. 14, 2014

(54) LIGHT EMITTING MODULE

(75) Inventor: Masanobu Mizuno, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 186 days.

(21) Appl. No.: 12/849,860

(22) Filed: Aug. 4, 2010

(65) Prior Publication Data

US 2011/0031520 A1    Feb. 10, 2011

(30) Foreign Application Priority Data

Aug. 7, 2009 (JP) .................................. 2009-185000

(51) Int. Cl.
*H01L 33/00* (2010.01)
*H01L 33/60* (2010.01)
*H01L 33/50* (2010.01)

(52) U.S. Cl.
CPC .............. *H01L 33/505* (2013.01); *H01L 33/60* (2013.01)
USPC ................................... 257/98; 257/E33.072

(58) Field of Classification Search
CPC .... H01L 25/0753; H01L 33/62; H01L 27/153
USPC ......................... 257/98, 88, E33.072
See application file for complete search history.

(56) References Cited

U.S. PATENT DOCUMENTS

| | | | |
|---|---|---|---|
| 7,312,560 B2 * | 12/2007 | Ouderkirk et al. ............. | 313/113 |
| 7,745,985 B2 * | 6/2010 | Tanimoto et al. ............. | 313/501 |
| 2003/0178627 A1 * | 9/2003 | Marchl et al. .................. | 257/80 |
| 2004/0257797 A1 | 12/2004 | Suehiro et al. | |
| 2005/0269582 A1 | 12/2005 | Mueller et al. | |
| 2007/0120463 A1 * | 5/2007 | Hayashi et al. ............... | 313/501 |
| 2007/0246712 A1 | 10/2007 | Kim et al. | |
| 2008/0080165 A1 * | 4/2008 | Kim et al. ........................ | 362/84 |
| 2008/0169480 A1 | 7/2008 | Weng et al. | |
| 2008/0180948 A1 * | 7/2008 | Yoon et al. .................... | 362/230 |
| 2009/0015138 A1 * | 1/2009 | Daicho et al. ................. | 313/503 |

(Continued)

FOREIGN PATENT DOCUMENTS

| | | |
|---|---|---|
| CN | 1742388 A | 3/2006 |
| EP | 2031657 A1 | 3/2009 |

(Continued)

OTHER PUBLICATIONS

Office Action Issued in Japanese Application No. 2009-185000, Dated Nov. 6, 2012 (8 Pages with English Translation).

(Continued)

*Primary Examiner* — Nikolay Yushin
(74) *Attorney, Agent, or Firm* — Osha Liang LLP

(57) ABSTRACT

A light emitting module includes: a light emitting element including: a first light emitting surface, and second light emitting surfaces bordering the first light emitting surface; an optical wavelength conversion member that converts a wavelength of light emitted from the light emitting element, wherein the optical wavelength conversion member is plate-shaped and is disposed such that an incident surface of the optical wavelength conversion member faces the first light emitting surface; and a reflecting member disposed to face the incident surface of the optical wavelength conversion member, the reflecting member comprising a reflecting surface. The reflecting surface faces the second light emitting surfaces, and the reflecting surface is inclined such that a distance between the reflecting surface and the second light emitting surfaces is gradually increased toward the incident surface of the optical wavelength conversion member.

14 Claims, 11 Drawing Sheets

(56) References Cited

U.S. PATENT DOCUMENTS

| | | | |
|---|---|---|---|
| 2009/0086482 A1* | 4/2009 | Wilm | 362/235 |
| 2009/0140633 A1* | 6/2009 | Tanimoto et al. | 313/503 |
| 2010/0187546 A1 | 7/2010 | Fushimi et al. | |

FOREIGN PATENT DOCUMENTS

| | | | | |
|---|---|---|---|---|
| JP | 2004095969 A | | 3/2004 | |
| JP | 2006-005367 A | | 1/2006 | |
| JP | 2006100441 A | | 4/2006 | |
| JP | 2007189239 A | | 7/2007 | |
| JP | 2008004948 A | | 1/2008 | |
| KR | 2009-0067180 A | | 6/2009 | |
| WO | WO2007/052777 | * | 5/2007 | H01L 33/00 |
| WO | 2007105647 A1 | | 9/2007 | |
| WO | 2008/078299 A1 | | 7/2008 | |

OTHER PUBLICATIONS

Patent Abstracts of Japan, Publication No. 2004095969, Dated: Mar. 25, 2004 (1 Page).
Patent Abstracts of Japan, Publication No. 2006-100441, Publication Date: Apr. 13, 2006 (1 Page).
Patent Abstracts of Japan, Publication No. 2007189239, Publication Date: Jul. 26, 2007 (1 Page).
Office Action Issued in Chinese Application No. 201010251938.2, Dated Jul. 11, 2012 (14 Pages With English Translation).
Office Action for Japanese Application No. 2009-185000 dated May 14, 2013, with English translation thereof (6 pages).
Espacenet, Patent Abstract for Japanese Publication No. 2008/4948 published Jan. 10, 2008 (2 pages).
Extended European Search Report for 10172008.4 dated Dec. 5, 2013 (8 pages).

* cited by examiner

FIG. 3
| W1 [μm] | 50 | 125 | 200 |
|---|---|---|---|
| MEAN LUMINANCE [cd/mm²] | 9.8 | 9.0 | 8.3 |
FIG. 4
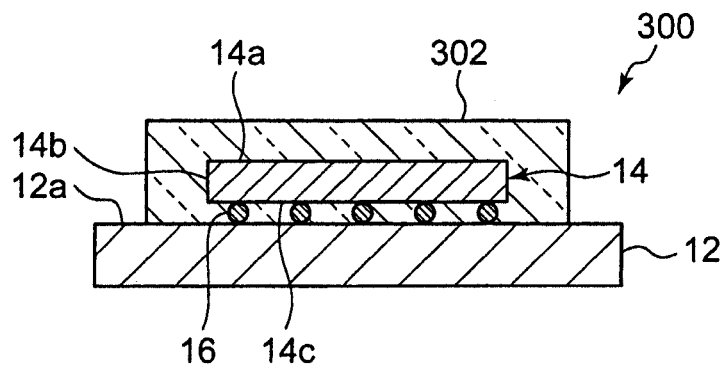
FIG. 5
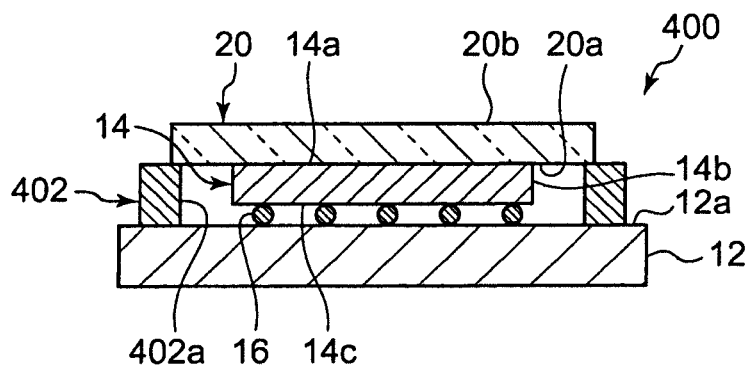

|  | COMPARATIVE EXAMPLE 1 | COMPARATIVE EXAMPLE 2 | FIRST EMBODIMENT |
|---|---|---|---|
| LUMINOUS FLUX | 1.0 | 1.0 | 1.2 |

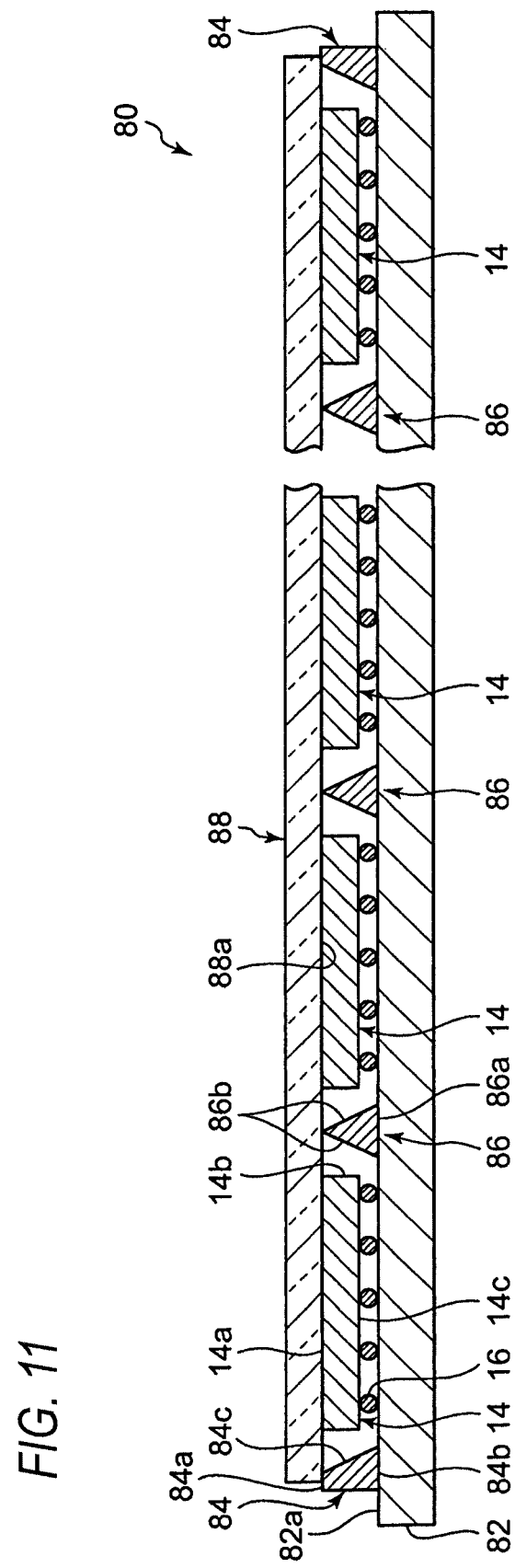

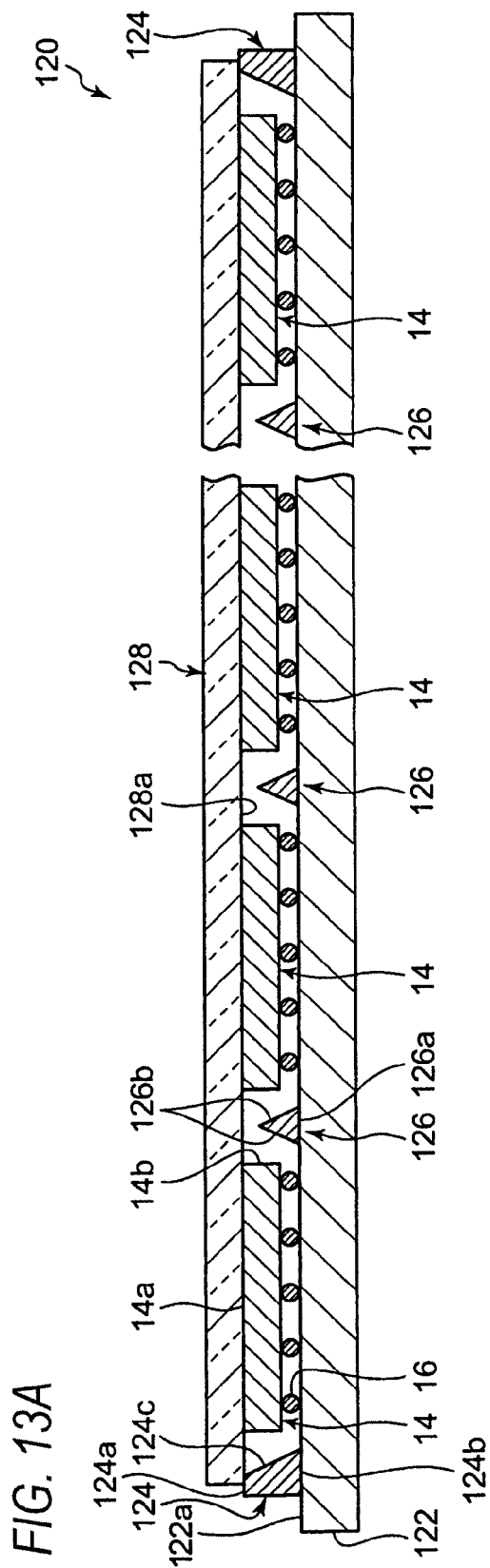
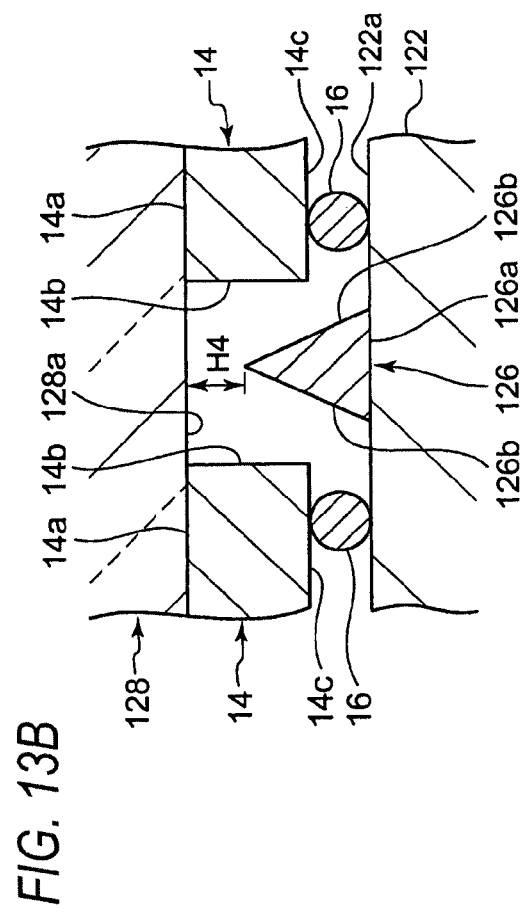
FIG. 13A
FIG. 13B

LIGHT EMITTING MODULE

BACKGROUND OF INVENTION

1. Field of the Invention

The present disclosure relates to a light emitting module, and more particularly, to a light emitting module that includes a light emitting element and an optical wavelength conversion member converting the wavelength of light emitted from the light emitting element and emitting light having the converted wavelength.

2. Related Art

In the past, there has been a technique that achieves a light emitting module that emits light, the color of which is different from the color of the light emitted from a light emitting element such as a Light Emitting Diode (LED), using phosphors or the like that convert the wavelength of the light that is emitted from the light emitting element. Meanwhile, there has been proposed a technique that disposes a ceramic layer which contains, for example, a wavelength conversion material on the path of the light emitted from a light emitting layer, in order to increase conversion efficiency when the wavelength of the light is converted (see e.g., JP-A-2006-5367 and its counterpart U.S. Pat. Pub. No. US2005/0269582 A1).

For example, a ceramic layer is generally formed in the shape of a plate. Accordingly, in JP-A-2006-5367, the ceramic layer is disposed so as to cover the light emitting element from above. Meanwhile, light is also emitted from the side surface of a semiconductor layer of a light emitting element. Further, for example, in a light emitting element where a substrate used for crystal growth and made of sapphire or the like is used as it is, light guided by the substrate is emitted from the side surface of the light emitting element. If the wavelength of the light emitted from the side surface cannot be appropriately converted, there occurs so-called color separation where the color of light of the light emitting element seen from above is different from that of light of the light emitting element seen from the side. Meanwhile, in order to avoid color separation, there is also considered a technique that blocks light emitted from the side surface of the light emitting element by providing a wall to face the side surface. However, there is a concern that loss of the light to be utilized occurs.

SUMMARY OF INVENTION

Exemplary embodiments of the present invention address the above disadvantages and other disadvantages not described above. However, those skilled in the art will appreciate that embodiments of the present invention are not required to overcome the disadvantages described above.

In an illustrative aspect, one or more embodiments of the present invention provide a light emitting module capable of effectively utilizing light that is emitted from a light emitting element.

According to one or more illustrative aspects, there is provided a light emitting module. The light emitting module comprises: a light emitting element comprising: a first light emitting surface and second light emitting surfaces bordering the first light emitting surface; a plate-like optical wavelength conversion member that converts a wavelength of light emitted from the light emitting element, wherein the optical wavelength conversion member is disposed such that an incident surface of the optical wavelength conversion member faces the first light emitting surface; and a reflecting member disposed to face the incident surface of the optical wavelength conversion member, the reflecting member comprising a reflecting surface. The reflecting surface faces the second light emitting surfaces and is inclined such that a distance between the reflecting surface and the second light emitting surfaces is gradually increased toward the incident surface of the optical wavelength conversion member.

According to this aspect, it may be possible to reflect the light, which is emitted from the second light emitting surfaces, toward the incident surface of the optical wavelength conversion member by the reflecting member that is disposed at the position facing the incident surface of the optical wavelength conversion member. Therefore, it may be possible to efficiently utilize the light that is emitted from the light emitting element.

According to one or more illustrative aspects, the reflecting member is made of silicon. If the reflecting member is made of silicon, it may be possible to easily form the reflecting surface, which is inclined as described above so that reflectance is high, by a method such as etching.

According to one or more illustrative aspects, the reflecting member further comprises: a vertical surface that borders the reflecting surface and extends in a direction substantially perpendicular to the first light emitting surface such that the optical wavelength conversion member is closer to the reflecting surface than the vertical surface.

According to this aspect, it may be possible to make the reflecting member be closer to the second light emitting surface while maintaining the angles of the reflecting surfaces, as compared to a case where the vertical surfaces are not provided. Accordingly, it may be possible to reduce low-luminance portions formed between the light emitting element and the reflecting member, and to increase the uniformity of luminance.

According to one or more illustrative aspects, a plurality of the light emitting elements are arranged with a distance interposed therebetween such that the respective first light emitting surfaces face the incident surface of the optical wavelength conversion member. A plurality of the reflecting members are disposed so as to surround each of the light emitting elements and so as to separate the light emitting elements adjacent to each other, and the reflecting surface of each of the reflecting members respectively faces the second light emitting surfaces of each of the light emitting elements.

According to this aspect, it may be possible to separate a pair of light emitting elements using the reflecting member. Accordingly, it may be possible to appropriately separate the light emitting elements while achieving the efficient light utilization in each of the pair of the light emitting elements.

According to one or more illustrative aspects, the optical wavelength conversion member is disposed such that the incident surface of the optical wavelength conversion member contacts the reflecting member.

According to this aspect, it may be possible to make the reflecting member have a function to support the optical wavelength conversion member. Accordingly, cost may be reduced as compared to a case where reflecting members and support members are separately provided.

According to one or more illustrative aspects, a gap is provided between the reflecting member and the incident surface of the optical wavelength conversion member.

According to this aspect, it may be possible to make the reflecting member be closer to the second light emitting surface while maintaining the angles of the reflecting surfaces, as compared to a case where the reflecting member comes into contact with the incident surface of the optical wavelength conversion member. Accordingly, it may be possible to reduce the emission area of the light emitting module, and to increase the luminance of the light emitting module.

Other aspects and advantages of the invention will be apparent from the following description, the drawings and the claims.

BRIEF DESCRIPTION OF DRAWINGS

FIG. 3 is a view showing mean luminance of the light emitting module when W1 is changed;

FIG. 4 is a cross-sectional view of a light emitting module according to Comparative example 1;

FIG. 5 is a cross-sectional view of a light emitting module according to Comparative example 2;

FIG. 11 is a cross-sectional view of a light emitting module according to a fourth embodiment of the invention;

FIG. 13A is a cross-sectional view of a light emitting module according to a sixth embodiment of the invention;

FIG. 13B is an enlarged view of the vicinity of a reflecting member in FIG. 13A;

DETAILED DESCRIPTION

Exemplary embodiments of the invention will be now described in detail with reference to the drawings.

First Embodiment

Figure 1A:
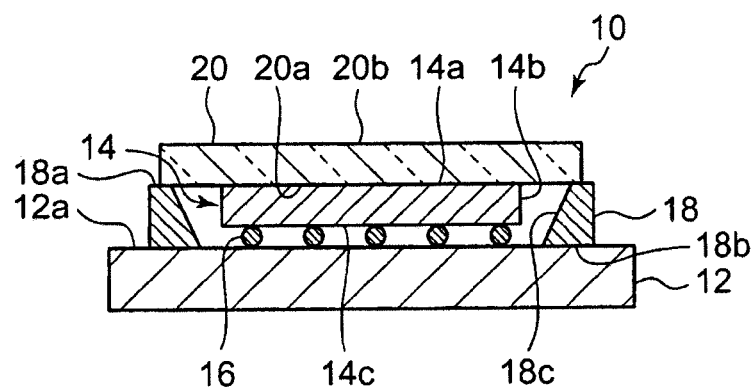
FIG. 1A is a cross-sectional view of a light emitting module according to a first embodiment of the invention.
Figure 1B:
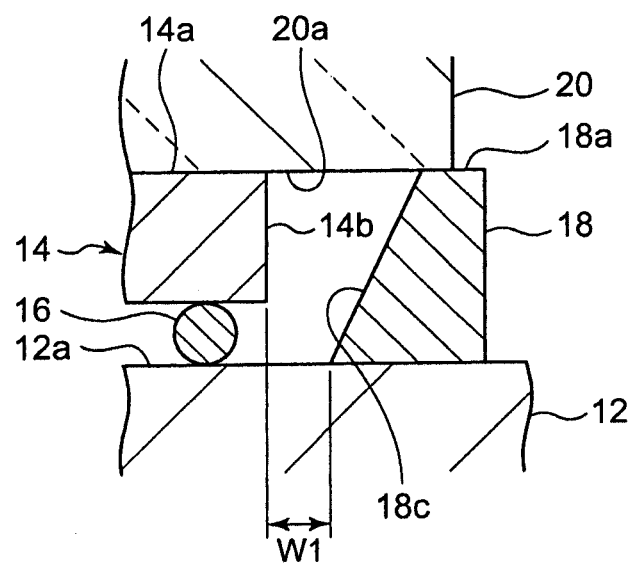
FIG. 1B is an enlarged view of the vicinity of a reflecting member in FIG. 1A.

FIG. 1A is a cross-sectional view of a light emitting module 10 according to a first embodiment of the invention. FIG. 1B is an enlarged view of the vicinity of a reflecting member 18 in FIG. 1A. The light emitting module 10 includes a mounting substrate 12, a semiconductor light emitting element 14, a reflecting member 18, and an optical wavelength conversion member 20.

The mounting substrate 12 is made of a material having high thermal conductivity such as AlN in the shape of a flat plate. Electrodes (not shown) are provided on a mounting surface 12a of the mounting substrate 12. The semiconductor light emitting element 14 is formed in the shape of a plate having six surfaces, that is, a first light emitting surface 14a that is a main light emitting surface having the square shape, four second light emitting surfaces 14b each of which borders the first light emitting surface 14a at a right angle, and a back surface 14c opposite to the first light emitting surface 14a. Meanwhile, the first light emitting surface 14a may border the second light emitting surface 14b at a predetermined angle other than a right angle.

The semiconductor light emitting element 14 is formed of an LED element. A blue LED, which mainly emits blue-wavelength light, is employed as the semiconductor light emitting element 14 in the first embodiment. Specifically, the semiconductor light emitting element 14 is formed of an InGaN-based LED element that is formed by growing the crystal of an InGaN-based semiconductor layer. Meanwhile, the material of the semiconductor light emitting element 14 is not limited thereto. For example, any one of InN, AlGaN, and AlN may be used.

The semiconductor light emitting element 14 is formed of a chip having a size of, for example, about 1 mm square, and is formed so that the center wavelength of emitted blue light is about 470 nm. Meanwhile, the structure of the semiconductor light emitting element 14 and the wavelength of light emitted from the semiconductor light emitting element are not limited to the above-mentioned structure and wavelength. A semiconductor light emitting element, which mainly emits light other than blue-wavelength light, may be employed as the semiconductor light emitting element 14.

A so-called flip-chip element is employed as the semiconductor light emitting element 14. Accordingly, an n-type electrode and a p-type electrode are provided on the back surface 14c of the semiconductor light emitting element 14. Electrodes provided on the mounting surface 12a of the mounting substrate 12 are connected to the n-type electrode and the p-type electrode, which are provided on the back surface 14c, by Au bumps 16. Accordingly, electric power may be supplied to the semiconductor light emitting element 14 through the electrodes of the mounting substrate 12.

The optical wavelength conversion member 20 is formed in the shape of a plate. The optical wavelength conversion member 20 is a so-called light emitting ceramic or fluorescent ceramic, and may be obtained by sintering a ceramic base made of YAG (Yttrium Aluminum Garnet) powder that is a phosphor excited by blue light. Because methods of manufacturing an optical wavelength conversion ceramic are well known, the detailed description thereof will be omitted herein. Meanwhile, the optical wavelength conversion member 20 is not limited to sintered ceramics, and may include, for example, an amorphous member, a polycrystalline member, and a single-crystalline member. The optical wavelength conversion member 20 is not limited by the crystalline structure, and the like.

Further, a transparent member is employed as the optical wavelength conversion member 20. In the first embodiment, "transparent" means that the total light transmittance of light in a conversion wavelength range is 40% or more. As a result of the dedicated research and development of the inventor, it has been found that it may be possible to appropriately convert the wavelength of light in the optical wavelength conversion member 20 and to appropriately suppress the reduction of the intensity of light passing through the optical wavelength conversion member in a transparent state where the total light transmittance of light in the conversion wavelength range is 40% or more. Accordingly, it may be possible to more efficiently convert the light, which is emitted from the semiconductor light emitting element 14, by allowing the optical wavelength conversion member 20 to be in the transparent state.

Furthermore, the optical wavelength conversion member 20 is made of an inorganic material, which does not contain an organic binder, in order to improve durability as compared to that of an optical wavelength conversion member that is made of an organic material such as an organic binder. For this reason, for example, electric power of 1 W (watt) or more may be applied to the light emitting module 10, so that it may be possible to increase the luminance, intensity, and flux of the light that is emitted from the light emitting module 10. Meanwhile, a binder may be contained in the optical wavelength conversion member 20.

The optical wavelength conversion member 20 converts the wavelength of blue light that is mainly emitted from the semiconductor light emitting element 14, and emits yellow light. For this reason, the light emitting module 10 emits white light, that is, combined light of blue light that is transmitted through the optical wavelength conversion member 20 as it is, and yellow light that is obtained by the wavelength conversion using the optical wavelength conversion member 20.

The optical wavelength conversion member 20 is formed with a thickness that is equal to or larger than 50 μm and smaller than 1000 μm. The optical wavelength conversion member 20 is formed by dies so as to have the same appearance as that of the first light emitting surface 14a of the semiconductor light emitting element 14 or appearance that is similar to the appearance of the first light emitting surface and larger than that of the first light emitting surface 14a by about 5% to 10%. The optical wavelength conversion member 20 is fixed to the first light emitting surface 14a of the semiconductor light emitting element 14 by an adhesive. In this case, an adhesive, such as a silicone-based adhesive, a sol-gel silica-based adhesive, a fluorine-based adhesive, or an inorganic glass-based adhesive, which is excellent in light resistance, may be used.

In this way, the optical wavelength conversion member 20 is disposed in the first embodiment so that an incident surface 20a of the optical wavelength conversion member 20 faces the first light emitting surface 14a. Light emitted from the semiconductor light emitting element 14 enters the incident surface 20a of the optical wavelength conversion member 20, so that the optical wavelength conversion member 20 converts the wavelength of the light and then emits the light from the emission surface 20b.

The semiconductor light emitting element 14 is formed by the single crystal growth of a semiconductor layer on a crystal growth substrate made of, for example, sapphire. In the semiconductor light emitting element 14 of the first embodiment where the sapphire is not removed and remains. For this reason, light guided by the crystal growth substrate is also emitted from the side surface of the light emitting element 14. Further, light is also emitted from a portion of the semiconductor layer of the second light emitting surface 14b. Meanwhile, an element, from which the crystal growth substrate has been removed, may be used as the semiconductor light emitting element 14. If neither the wavelength of the light emitted from the first light emitting surface 14a, nor the wavelength of the light emitted from the second light emitting surface 14b may also be appropriately converted as described above, there is a concern that so-called color separation occurs.

For this reason, the light emitting module 10 is provided with the reflecting member 18 in the first embodiment. The reflecting member 18 is formed in the shape of a rectangular frame, and has a quadrangular cross section. The reflecting member 18 is placed on the mounting surface 12a of the mounting substrate 12 so as to surround the semiconductor light emitting element 14, and a lower surface 18b of the reflecting member is fixed to the mounting surface 12a by adhesion. An adhesive used in this case is the same as described above. The reflecting member 18 may be bonded to the mounting substrate 12 by solder bonding, surface activation bonding, anodic oxidation bonding, or the like. Meanwhile, when the light emitting module 10 is manufactured, the semiconductor light emitting element 14 is mounted on the mounting surface 12a of the mounting substrate 12 with Au bumps 16 interposed therebetween after the reflecting member 18 is fixed to the mounting substrate 12 before the mounting of the semiconductor light emitting element 14.

The incident surface 20a of the optical wavelength conversion member 20 is placed on an upper surface 18a, which is opposite to the lower surface 18b of the outer surface of the reflecting member 18, and is fixed to the upper surface by adhesion. An adhesive used in this case is the same as described above. In this way, the reflecting member 18 is disposed at a position that faces the incident surface 20a of the optical wavelength conversion member 20. In one or more embodiments, due to being adhered to the semiconductor light emitting element 14, the optical wavelength conversion member 20 may not be fixed to the reflecting member 18.

The reflecting member 18 includes a reflecting surface 18c that faces the second light emitting surface 14b of the semiconductor light emitting element 14. The reflecting surface 18c is inclined to be separated from the second light emitting surface 14b as approaching the incident surface 20a of the optical wavelength conversion member 20. In other words, the reflecting surface 18c is inclined such that a distance between the reflecting surface 18c and the second light emitting surface 14b is gradually increased from the lower surface 18b to the upper surface 18a. If the reflecting surface 18c is formed as described above, it may be possible to reflect light, which is emitted from the second light emitting surface 14b of the semiconductor light emitting element 14, toward the incident surface 20a of the optical wavelength conversion member 20. Accordingly, it may be possible to effectively utilize the light that is emitted from the second light emitting surface 14b, and to increase the intensity of light emitted from the light emitting module 10 as compared to when the reflecting surface 18c is not provided.

The reflecting member 18 may be made of silicon. If the reflecting member 18 is made of silicon as described above, it may be possible to easily form the reflecting surface 18c by etching. When the reflecting member 18 is manufactured, first, masking is formed on a portion, which corresponds to the upper surface 18a, of a flat plate-like substrate made of single-crystalline silicon. Then, wet etching is performed from the side of the substrate on which masking has been formed, so that the reflecting surface 18c is formed. Because wet etching methods are well known, the description thereof will be omitted herein.

It may be possible to easily form the reflecting surface 18c by performing wet etching on single-crystalline silicon as described above. If the reflecting member 18 is made of single-crystalline silicon, it may be possible to form the reflecting surface 18c with an accurate inclination angle of about 54.7° between the reflecting surface 18c and the upper surface 18a. After the reflecting surface 18c is formed, the masking is removed. Those skilled in the art will appreciate that the reflecting member 18 may be made of a material other than silicon.

A reflecting film having a reflectance of 85% or more is formed on the surface of the reflecting member 18 by depositing, for example, aluminum or silver on the surface of the reflecting member 18. In order to supply appropriate current, the reflecting film is formed at a position that is higher than the lower surface 18b by 5 μm or more. Those skilled in the art will appreciate that the reflecting member 18 may be made of a material other than silicon. The reflecting member 18 may be formed so that an inclination angle of the reflecting surface 18c with respect to the upper surface 18a is in the range of about 20° to 70°.

A distance between the second light emitting surface 14b of the semiconductor light emitting element 14 and the reflecting surface 18c of the reflecting member 18 in a horizontal direction is denoted by W1 as shown in FIG. 1B, and W1 is set to 50 μm or less in the first embodiment. The basis of the setting of W1 to 50 μm or less will be described below with reference to FIGS. 2 and 3.

Figure 2:
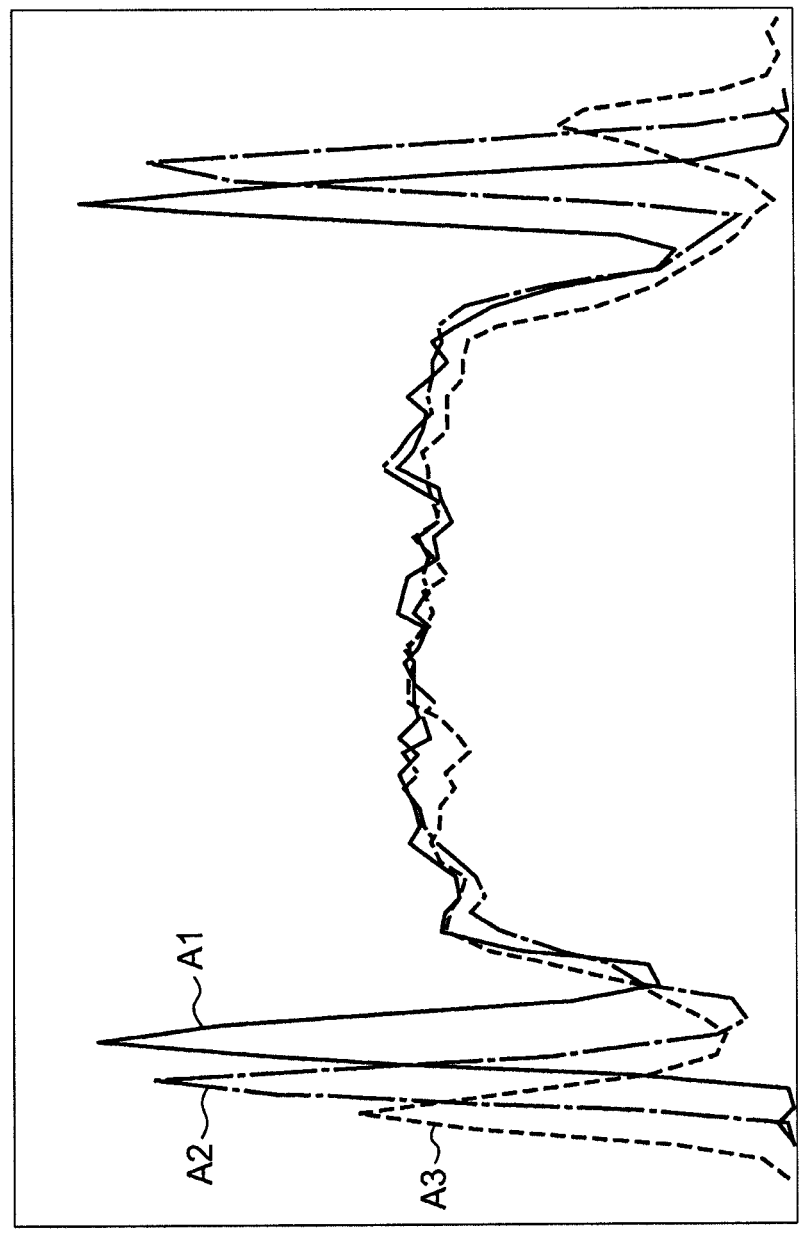
FIG. 2 is a view showing luminance distribution between one end and the other end of the light emitting module according to the first embodiment.

FIG. 2 is a view showing luminance distribution between one end and the other end of the light emitting module 10 according to the first embodiment. In FIG. 2, a horizontal axis represents positions between one end and the other end of the light emitting module 10 and a vertical axis represents a light intensity ratio relative to mean light intensity. Further, A1 shows a case where W1 is 50 μm, A2 shows a case where W1 is 125 μm, and A3 shows a case where W1 is 200 μm. As W1 increases, a region where the intensity ratio of luminance is low widens near the end of the light emitting module 10 as shown in FIG. 2.

FIG. 3 is a view showing mean luminance of the light emitting module 10 when W1 is changed. As W1 increases, mean luminance decreases as shown in FIG. 3. Accordingly, the distance between the second light emitting surface 14b of the semiconductor light emitting element 14 and the reflecting surface 18c of the reflecting member 18 needs to be shortened in order to obtain a semiconductor element having high luminance. As a result of the research and development of the inventor, it has been found that W1 needs to be set to 50 μm in order to obtain mean luminance large enough for use in illumination or the like.

FIG. 4 is a cross-sectional view of a light emitting module 300 according to Comparative example 1. Hereinafter, the same components as those of the light emitting module 10 are denoted by the same reference numerals and the description thereof will be omitted herein.

The light emitting module 300 has the same structure as that of the light emitting module 10 according to the first embodiment except that the reflecting member 18 and the optical wavelength conversion member 20 are not provided and an optical wavelength conversion member 302 is provided. Not phosphor ceramics, but phosphor paste is used as the optical wavelength conversion member 302, unlike the optical wavelength conversion member 20 of the first embodiment. The phosphor paste is formed by mixing the particles of the same phosphors as the phosphors, which are contained in the optical wavelength conversion member 20, in a transparent binder paste. The phosphor paste is potted so as to cover the semiconductor light emitting element 14, or is molded and hardened, so that the optical wavelength conversion member 302 is formed. Meanwhile, the thickness of the optical wavelength conversion member 302 formed on the semiconductor light emitting element 14 is equal to that of the optical wavelength conversion member 20 of the first embodiment.

FIG. 5 is a cross-sectional view of a light emitting module 400 according to Comparative example 2. Hereinafter, the same components as those of the light emitting module 10 are denoted by the same reference numerals and the description thereof will be omitted herein. The light emitting module 400 has the same structure as that of the light emitting module 10 according to the first embodiment except that a reflecting member 402 is provided instead of the reflecting member 18. The reflecting member 402 is made of the same material as that of the reflecting member 18 in the shape of a rectangular frame. A method of fixing the reflecting member 402 to the mounting substrate 12 is the same as the method of fixing the optical wavelength conversion member 20.

A reflecting film having a reflectance of 85% or more is formed on a reflecting surface 402a, which faces the second light emitting surface 14b of the semiconductor light emitting element 14, of the reflecting member 402 by depositing, for example, aluminum or silver on the reflecting surface 402a. The reflecting member 402 is formed to have a rectangular cross section. Accordingly, the reflecting surface 402a extends perpendicular to the mounting surface 12a of the mounting substrate 12 and the first light emitting surface 14a of the semiconductor light emitting element 14.

Figures 6, 7:
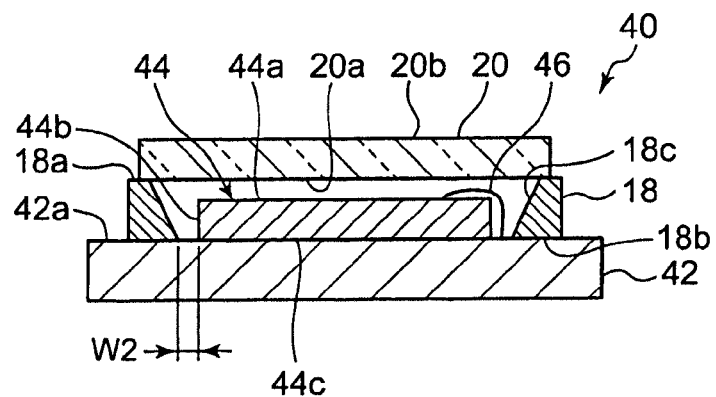
FIG. 6 is a view showing the luminous flux of respective light emitting modules according to Comparative examples 1 and 2 and the first embodiment.
FIG. 7 is a cross-sectional view of a light emitting module according to a second embodiment of the invention.

FIG. 6 is a view showing the luminous flux of respective light emitting modules according to Comparative examples 1 and 2 and the first embodiment. As can be seen from FIG. 6, luminous flux, which is higher than the luminous flux obtained from the light emitting module 300 according to Comparative example 1 and the light emitting module 400 according to Comparative example 2, is obtained from the light emitting module 10 according to the first embodiment. Accordingly, it is found that the reflecting surface 18c formed on the reflecting member 18 contributes to the increase of luminous flux.

Second Embodiment

FIG. 7 is a cross-sectional view of a light emitting module 40 according to a second embodiment of the invention. Hereinafter, the same components as those of the first embodiment are denoted by the same reference numerals and the description thereof will be omitted herein.

The light emitting module 40 has the same structure as that of the light emitting module 10 according to the first embodiment except that a mounting substrate 42 is provided instead of the mounting substrate 12 and a semiconductor light emitting element 44 is provided instead of the semiconductor light emitting element 14. A so-called vertical chip type semiconductor light emitting element is employed as the semiconductor light emitting element 44. The material or shape of the mounting substrate 42 is the same as that of the mounting substrate 12 of the first embodiment, but electrodes formed on a mounting surface 42a are connected to the vertical chip type semiconductor light emitting element 44. An electrode formed on a back surface 44c of the semiconductor light emitting element 44 is directly connected to an electrode formed on the mounting surface 42a, and an electrode formed on a first light emitting surface 44a of the semiconductor light emitting element 44 are connected to the electrode of the mounting surface 42a through a conductive wire 46.

In the light emitting module 40, the first light emitting surface 44a of the semiconductor light emitting element 44 is not fixed to the incident surface 20a of the optical wavelength conversion member 20, and a gap where the conductive wire 46 is led is formed between the first light emitting surface and the incident surface. Accordingly, the incident surface 20a adheres to the upper surface 18a of the reflecting member 18, so that the optical wavelength conversion member 20 is fixed.

A distance between the second light emitting surface 44b of the semiconductor light emitting element 44 and the reflecting surface 18c of the reflecting member 18 in a horizontal direction is denoted by W2 as shown in FIG. 7, and W2 is set in the range of about 20 to 100 μm in the second embodiment.

The reflecting surface 18c is inclined to be separated from the second light emitting surface 44b as approaching the incident surface 20a of the optical wavelength conversion member 20. In other words, the reflecting surface 18c is inclined such that a distance between the reflecting surface 18c and the second light emitting surface 44b is gradually increased from the lower surface 18b to the upper surface 18a. Even in the case of a vertical chip type semiconductor light emitting element 44, light is emitted from the second light emitting surface 44b that borders the first light emitting surface 44a. If the reflecting surface 18c is formed as described above, it may be possible to efficiently utilize the light that is emitted from the semiconductor light emitting element 44.

Third Embodiment

Figure 8A:
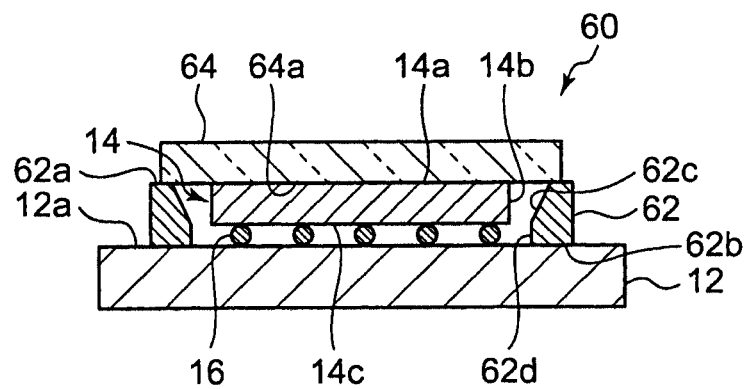
FIG. 8A is a cross-sectional view of a light emitting module according to a third embodiment of the invention.
Figure 8B:
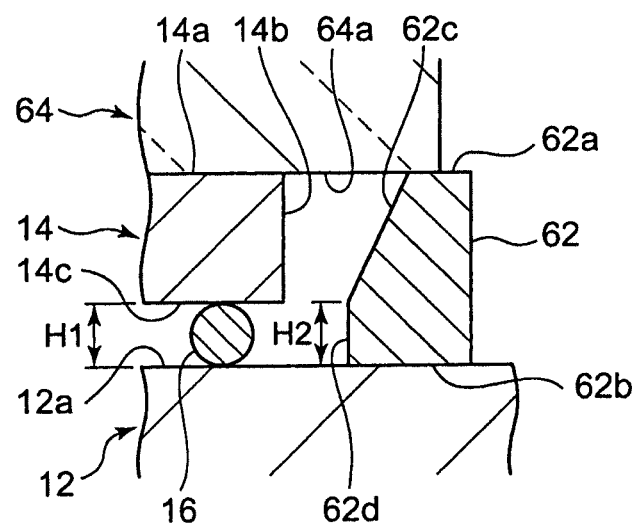
FIG. 8B is an enlarged view of the vicinity of a reflecting member in FIG. 8A.

FIG. 8A is a cross-sectional view of a light emitting module 60 according to a third embodiment of the invention. FIG. 8B is an enlarged view of the vicinity of a reflecting member 62 in FIG. 8A. Hereinafter, the same components as those of the above-mentioned embodiment are denoted by the same reference numerals and the description thereof will be omitted herein.

The light emitting module 60 has the same structure as that of the light emitting module 10 according to the first embodiment except that a reflecting member 62 is provided instead of the reflecting member 18. The reflecting member 62 is formed in the shape of a rectangular frame. The reflecting member 62 is also placed on the mounting surface 12a of the mounting substrate 12 so as to surround the semiconductor light emitting element 14, and a lower surface 62b of the reflecting member is fixed to the mounting surface 12a by adhesion. Meanwhile, when the light emitting module 40 is manufactured, the third embodiment is the same as the first embodiment in that the semiconductor light emitting element 14 is mounted on the mounting surface 12a of the mounting substrate 12 after the reflecting member 62. Further, the third embodiment is also the same as the first embodiment in that the incident surface 20a of the optical wavelength conversion member 20 is fixed to an upper surface 62a of the reflecting member 62.

Furthermore, the reflecting member 62 also includes reflecting surfaces 62c. The reflecting surface 62c is inclined to be separated from the second light emitting surface 14b as approaching the incident surface 20a of the optical wavelength conversion member 20. In other words, the reflecting surface 62c is inclined such that a distance between the reflecting surface 62c and the second light emitting surface 14b is gradually increased from the lower surface 62b to the upper surface 62a. A method of forming the reflecting surface 62c or the inclination angle of the reflecting surface 62c is the same as the method of forming the reflecting surface 18c of the first embodiment or the inclination angle of the reflecting surface 18c.

Meanwhile, the reflecting member 62 includes vertical surfaces 62d. The vertical surface 62d borders the reflecting surface 62c, and extends perpendicular to the first light emitting surface 14a and the mounting surface 12a at a position that is more distant from the optical wavelength conversion member 64 than the reflecting surface 62c. If the vertical surface 62d is formed as described above, it may be possible for the reflecting member 62 to be close to the second light emitting surface 14b of the semiconductor light emitting element 14 and for the formation of low-luminance portions between the reflecting member 62 and the semiconductor light emitting element 14 to be suppressed. Further, it may be possible to suppress the increase of the area of an opening of the reflecting member 62 and to increase the luminance of the light emitting module 60.

The reflecting member 62 may be also made of silicon. When the vertical surface 62d is formed, the reflecting surface 62c is formed by the same method as the method of forming the reflecting surface 18c of the first embodiment and masking is formed on a portion of a substrate corresponding to the lower surface 62b. Then, dry etching is performed at this time from the side of the substrate on which masking has been formed, so that the vertical surface 62d is formed. Because dry etching methods are well known, the description thereof will be omitted herein. If the vertical surface 62d is formed by dry etching, it may be possible to form the vertical surface 62d that extends substantially perpendicular to the lower surface 62b. After the vertical surface 62d is formed, the masking is removed again. Those skilled in the art will appreciate that the reflecting member 62 may be made of a material other than silicon.

As shown in FIG. 8B, the height of a gap between the mounting surface 12a of the mounting substrate 12 and the back surface 14c of the semiconductor light emitting element 14 is referred to as a non-light emitting region height H1, the height of the vertical surface 62d is referred to as a vertical surface height H2, and the reflecting member 62 is formed in the third embodiment so that the vertical surface height H2 is equal to the non-light emitting region height H1.

Figure 9:
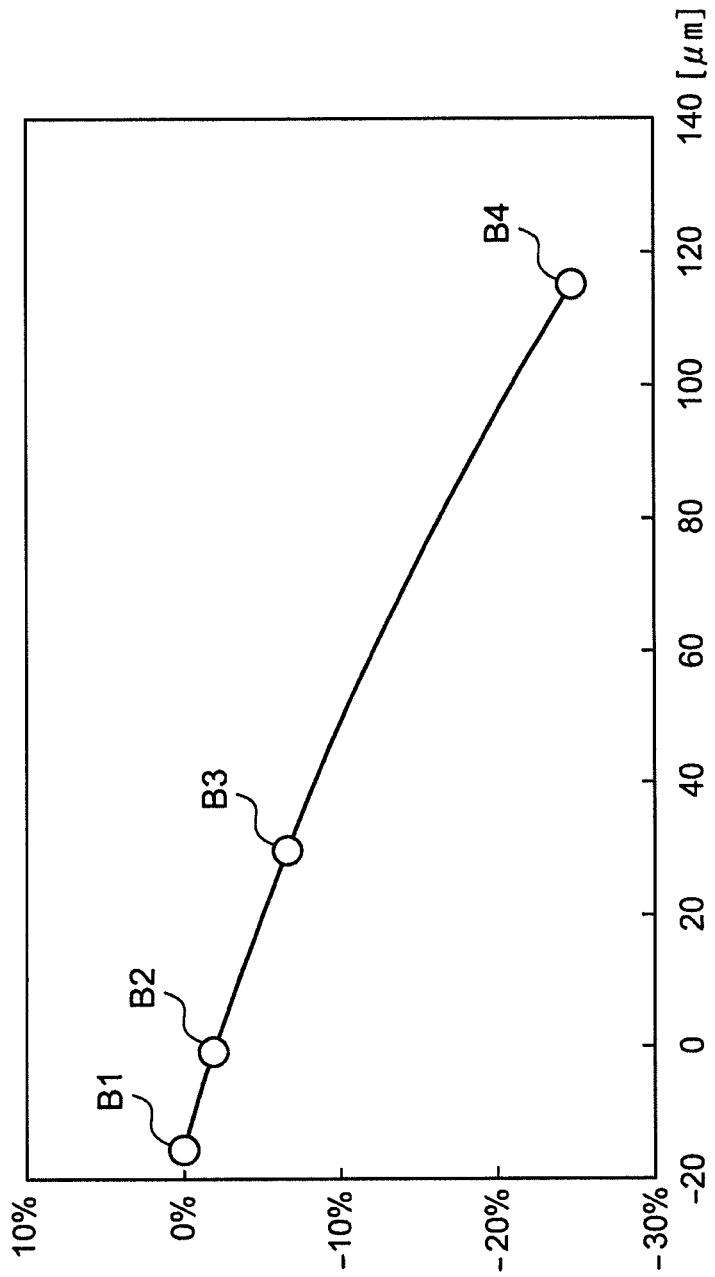
FIG. 9 is a view showing a relationship between the height of a vertical surface and the extraction loss of light emitted from a semiconductor light emitting element.

FIG. 9 is a view showing a relationship between the height of the vertical surface 62d and the extraction loss of light emitted from the semiconductor light emitting element 14. In FIG. 9, a horizontal axis represents a value that is obtained by subtracting the non-light emitting region height H1 from the vertical surface height H2, and a vertical axis represents the extraction loss of the light emitted from the semiconductor light emitting element 14. The extraction loss means a ratio of the amount of light decreased when the reflecting member 62 is provided to the amount of light when the reflecting member 62 is not provided. Further, B1 shows a case where the vertical surface height H2 is set to zero, and B2 shows a case where the vertical surface height H2 is set to the same height as the non-light emitting region height H1. B3 shows a case where a difference between the vertical surface height H2 and the non-light emitting region height H1 is set to about 30 μm, and B4 shows a case where the reflecting surface 62c is not formed and only the vertical surface 62d is formed.

As shown in FIG. 9, it may be possible to make the extraction loss of light be substantially zero in the case of B1 and to make the extraction loss of light be a value close to zero even in the case of B2. In the case of B3, it may be possible to suppress the extraction loss of light so that the extraction loss of light is 10% or less. However, in the case of B4, the extraction loss of light is 20% or more. Accordingly, it is found that B1 to B3 are advantageous and B1 or B2 is the most advantageous in terms of the extraction loss of light.

Figure 10:
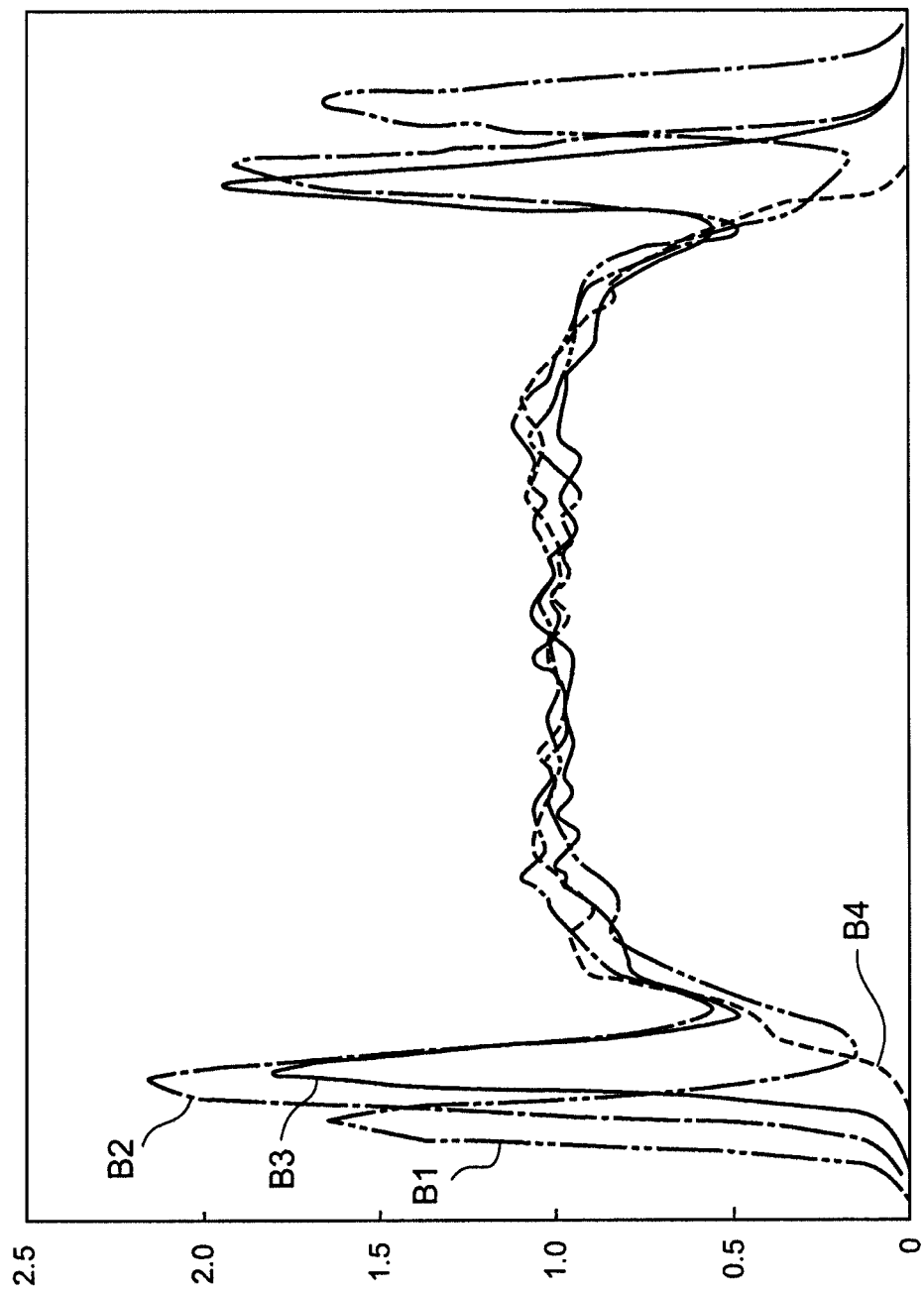
FIG. 10 is a view showing luminance distribution between one end and the other end of the light emitting module according to the third embodiment.

FIG. 10 is a view showing luminance distribution between one end and the other end of the light emitting module 60 according to the third embodiment. In FIG. 10, a horizontal axis represents positions between one end and the other end of the light emitting module 60 and a vertical axis represents a light intensity ratio relative to mean light intensity.

Because the vertical surface 62d is not formed in the case of B1, the reflecting member 62 cannot be provided so close to the second light emitting surface 14b of the semiconductor light emitting element 14 as shown in FIG. 10. For this reason, a low light intensity portion is formed between the reflecting member 62 and the semiconductor light emitting element 14. Further, in the case of B4, it is difficult to make the light, which is emitted from the second light emitting surface 14b, enter the optical wavelength conversion member 64. Accordingly, a light intensity ratio is dramatically decreased near both ends. Meanwhile, in the cases of B2 and B3, there are portions where light intensity is decreased. However, the light intensity ratios in the cases of B2 and B3 are higher than the light intensity ratio in the case of B1 or B4, and are set to 0.5 or more. Therefore, it is found that B2 or B3 is advantageous in terms of luminance distribution. From the above description, it is found that the case of B2 where the vertical surface height H2 is equal to the non-light emitting region height H1 is most advantageous in terms of both the extraction loss of light and luminance distribution.

Fourth Embodiment

FIG. 11 is a cross-sectional view of a light emitting module 80 according to a fourth embodiment of the invention. Hereinafter, the same components as those of the above-mentioned embodiment are denoted by the same reference numerals and the description thereof will be omitted herein.

The light emitting module 80 includes a mounting substrate 82, semiconductor light emitting elements 14, a reflecting member 84, reflecting members 86, and an optical wavelength conversion member 88. The mounting substrate 82 is made of the same material as that of the mounting substrate 12 of the first embodiment in the shape of a plate. However, a plurality of semiconductor light emitting elements 14 are mounted on the mounting substrate 82 in the light emitting module 80. The mounting substrate 82 has an area large enough for the plurality of semiconductor light emitting elements 14 to be mounted. Electrodes are provided on a mounting surface 82a of the mounting substrate 82, and the plurality of semiconductor light emitting elements 14 are connected and fixed to the electrodes through Au bumps 16. The plurality of semiconductor light emitting elements 14 are electrically connected to one another in parallel or series by the electrodes so that current can be supplied to the plurality of semiconductor light emitting elements 14, respectively.

In the fourth embodiment, the plurality of semiconductor light emitting elements 14 are mounted on the mounting substrate 82 in a line. However, a plurality of mounting substrates 82 may be arranged parallel to each other so as to form a plurality of lines, that is, the plurality of mounting substrates 82 may be arranged parallel to each other on a plane.

The cross-sectional shape or material of the reflecting member 84 is the same as that of the reflecting member 18 of the first embodiment except that the reflecting member 84 is formed so as to surround the plurality of semiconductor light emitting elements 14. Further, the optical wavelength conversion member 88 is formed to have a size large enough to cover an opening of the reflecting member 84. The optical wavelength conversion member 88 is also formed in the shape of a plate. The material of the optical wavelength conversion member 88 is the same as that of the optical wavelength conversion member 20 of the first embodiment.

Accordingly, a lower surface 84b of the reflecting member 84 adheres to the mounting surface 82a, so that the reflecting member 84 is fixed to the mounting substrate 82. An adhesive used in this case is the same as described above, and a method of fixing the reflecting member 84 is not limited to adhesion, which is the same as described above. Further, an incident surface 88a of the optical wavelength conversion member 88 adheres to an upper surface 84a of the reflecting member 84, so that the optical wavelength conversion member 88 is fixed. In this way, the plurality of semiconductor light emitting elements 14 are arranged parallel to each other with a distance therebetween so that the respective first light emitting surfaces 14a face the incident surface 88a of a single optical wavelength conversion member 88. Reflecting surfaces 84c face the second light emitting surfaces 14b except for the second light emitting surfaces 14b facing each other, among the respective second light emitting surfaces 14b. Accordingly, the reflecting surfaces 84c face the second light emitting surfaces 14b parallel to the arrangement direction of the semiconductor light emitting elements 14, among the respective second light emitting surfaces 14b of the plurality of semiconductor light emitting elements 14. Further, the reflecting surfaces 84c also face the outer second light emitting surfaces 14b of the semiconductor light emitting elements 14 that are positioned on both ends.

The reflecting surfaces 84c are inclined to be separated from the second light emitting surfaces 14b facing the reflecting surfaces 84c as approaching the incident surface 88a of the optical wavelength conversion member 88. In other words, the reflecting surface 84c is inclined such that a distance between the reflecting surface 84c and the second light emitting surface 14b is gradually increased from the lower surface 84b to the upper surface 84a. Accordingly, even when the plurality of semiconductor light emitting elements 14 are mounted, it may be possible to suppress the formation of low-luminance portions near the edges of the optical wavelength conversion member 88.

Furthermore, in the fourth embodiment, the reflecting member 86 is disposed between each pair of semiconductor light emitting elements 14 so that the pair of semiconductor light emitting elements 14 adjacent to each other is divided among the plurality of semiconductor light emitting elements 14. Because the plurality of semiconductor light emitting elements 14 are arranged in a line in the fourth embodiment, the number of the reflecting members 86 is smaller than that of the semiconductor light emitting elements 14 by one. Meanwhile, even when the plurality of semiconductor light emitting elements 14 are arranged parallel to each other on a plane so as to form a plurality of lines, the reflecting member 86 is disposed between each pair of semiconductor light emitting elements so that the pair of semiconductor light emitting elements 14 adjacent to each other is divided.

The reflecting member 86 is formed in the shape of a triangular prism. Among three side surfaces of the reflecting member 86, one side surface forms a lower surface 86a and the other two side surfaces form reflecting surfaces 86b. The lower surface 86a adheres to the mounting surface 82a, so that the reflecting member 86 is fixed to the mounting substrate 82. An adhesive used in this case is the same as described above, and a method of fixing the reflecting member 86 is not limited to adhesion, which is the same as described above.

In this way, the reflecting member 86 is disposed so that two reflecting surfaces 86b face the respective second light emitting surfaces 14b, which face each other, of the pair of semiconductor light emitting elements 14 adjacent to each other. The reflecting member 86 is formed with a height so that an apex of the reflecting member 86 between the pair of reflecting surfaces 86b comes into contact with the incident surface 88a of the optical wavelength conversion member 88.

Each of the pair of reflecting surfaces 86b is inclined to be separated from the second light emitting surface 14b facing the reflecting surface as approaching the incident surface 88a of the optical wavelength conversion member 88. In other words, the reflecting surface 86b is inclined such that a distance between the reflecting surface 86b and the second light emitting surface 14b is gradually increased from the lower surface 86a to the apex of the reflecting member 86. If the reflecting members 86 are formed as described above, it may be possible to suppress the formation of low-luminance portions between the semiconductor light emitting elements 14 even when the plurality of semiconductor light emitting elements 14 are arranged parallel to each other. Further, it may be possible to effectively utilize the light that is emitted from each of the semiconductor light emitting elements 14. Meanwhile, the reflecting surfaces 86b may be formed to face the second light emitting surfaces 14b of at least one of the pair of semiconductor light emitting elements 14.

The reflecting member 84 and the reflecting members 86 are integrally made of silicon. When the reflecting member 84 and the reflecting members 86 are manufactured, first, masking is formed on portions, which correspond to the upper surface 84a of the reflecting member 84 and the apexes of the reflecting members 86 where the pairs of reflecting surfaces 86b cross each other, of a flat plate-like substrate made of single-crystalline silicon. Then, wet etching is performed from the side of the substrate on which masking has been formed, so that the reflecting surfaces 84c and the reflecting surfaces 86b are formed. For this reason, the reflecting surface 84c and the reflecting surfaces 86b are inclined with respect to the upper surface 84a by an angle of about 54.7°. Those skilled in the art will appreciate that the reflecting member 84 and the reflecting members 86 may be made of a material other than silicon.

Fifth Embodiment

Figure 12A:
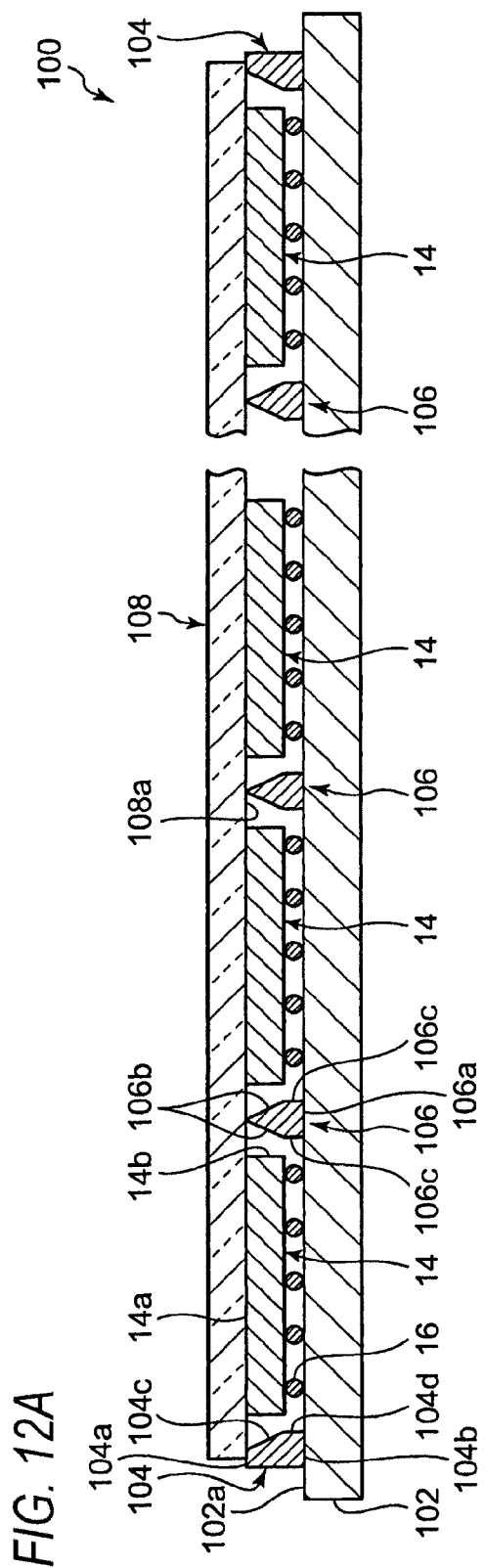
FIG. 12A is a cross-sectional view of a light emitting module according to a fifth embodiment of the invention.
Figure 12B:
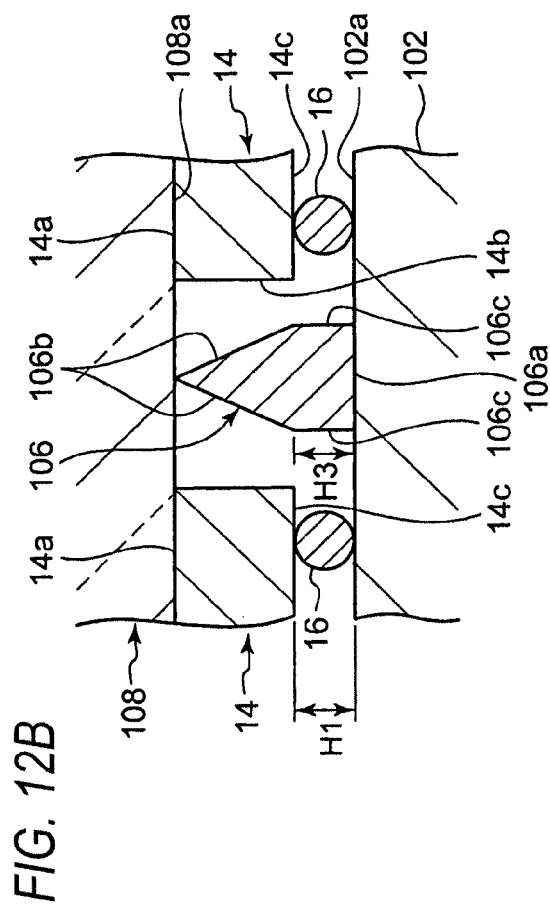
FIG. 12B is an enlarged view of the vicinity of a reflecting member in FIG. 12A.

FIG. 12A is a cross-sectional view of a light emitting module 100 according to a fifth embodiment of the invention. FIG. 12B is an enlarged view of the vicinity of a reflecting member 106 in FIG. 12A. Hereinafter, the same components as those of the above-mentioned embodiment are denoted by the same reference numerals and the description thereof will be omitted herein.

The light emitting module 100 includes a mounting substrate 102, semiconductor light emitting elements 14, a reflecting member 104, reflecting members 106, and an optical wavelength conversion member 108. The mounting substrate 102 is made of the same material as that of the mounting substrate 12 of the first embodiment in the shape of a plate. The fifth embodiment is the same as the fourth embodiment in that a plurality of semiconductor light emitting elements 14 are mounted in a line on a mounting surface 102a of the mounting substrate 102. However, as described below, the plurality of semiconductor light emitting elements 14 are mounted on the mounting surface 102a of the mounting substrate 102 with a distance, which is smaller than the distance between the semiconductor light emitting elements of the fourth embodiment, therebetween. For this reason, the entire length of the mounting substrate 102 or an electrode formed on the mounting surface 102a of the mounting substrate 102 is different from that of the mounting substrate 82.

The cross-sectional shape or material of the reflecting member 104 is the same as that of the reflecting member 62 of the third embodiment except that the reflecting member 104 is formed to have a size large enough to surround the plurality of semiconductor light emitting elements 14. The optical wavelength conversion member 108 is formed in the shape of a plate that has a size large enough to cover an opening of the reflecting member 104. The material of the optical wavelength conversion member 108 is the same as that of the optical wavelength conversion member 20 of the first embodiment.

Accordingly, a lower surface 104b of the reflecting member 104 adheres to the mounting surface 102a, so that the reflecting member 104 is fixed to the mounting substrate 102. An adhesive used in this case is the same as described above, and a method of fixing the reflecting member 104 is not limited to adhesion, which is the same as described above. Further, an incident surface 108a of the optical wavelength conversion member 108 adheres to an upper surface 104a of the reflecting member 104, so that the optical wavelength conversion member 108 is fixed. In this way, the plurality of semiconductor light emitting elements 14 are arranged parallel to each other with a distance therebetween so that the respective first light emitting surfaces 14a face the incident surface 108a of a single optical wavelength conversion member 108.

Like the reflecting surfaces 84c of the fourth embodiment, reflecting surfaces 104c face the second light emitting surfaces 14b parallel to the arrangement direction of the semiconductor light emitting elements 14, among the respective second light emitting surfaces 14b of the semiconductor light emitting elements 14. Further, the reflecting surfaces 84c also face the respective outer second light emitting surfaces 14b of the semiconductor light emitting elements 14 that are positioned on both ends. The reflecting surfaces 104c are inclined to be separated from the second light emitting surfaces 14b facing the reflecting surfaces 104c as approaching the incident surface 108a of the optical wavelength conversion member 108. In other words, the reflecting surface 104c is inclined such that a distance between the reflecting surface 104c and the second light emitting surface 14b is gradually increased toward the upper surface 104a.

Even in the fifth embodiment, the reflecting member 106 is disposed between each pair of semiconductor light emitting elements 14 so that the pair of semiconductor light emitting elements 14 adjacent to each other is divided among the plurality of semiconductor light emitting elements 14. Because the plurality of semiconductor light emitting elements 14 are arranged in a line, the number of the reflecting members 106 is smaller than that of the semiconductor light emitting elements 14 by one, which is the same as described above. Meanwhile, even when the plurality of semiconductor light emitting elements 14 are arranged parallel to each other on a plane so as to form a plurality of lines, the reflecting member 106 is disposed between each pair of semiconductor light emitting elements so that the pair of semiconductor light emitting elements 14 adjacent to each other is divided.

In the fifth embodiment, the reflecting member 106 is formed in the shape of a pentagonal prism that includes a lower surface 106a, a pair of vertical surfaces 106c bordering the lower surface 106a so as to be perpendicular to the lower surface, and a pair of reflecting surfaces 106b inclined with respect to the pair of vertical surfaces 106c at the same angle, as side surfaces. The lower surface 106a adheres to the mounting surface 102a, so that the reflecting member 106 is fixed to the mounting substrate 102. An adhesive used in this case is the same as described above. The reflecting member 106 may be bonded to the mounting substrate 102 by solder bonding, surface activation bonding, anodic oxidation bonding, or the like.

The pair of reflecting surfaces 106b faces the respective second light emitting surfaces 14b, which face each other, of the pair of semiconductor light emitting elements 14 adjacent to each other. The reflecting member 106 is formed so that an apex of the reflecting member 106 between the pair of reflecting surfaces 106b comes into contact with the incident surface 108a of the optical wavelength conversion member 108. Meanwhile, the reflecting surfaces 106b may be formed to face the second light emitting surfaces 14b of at least one of the pair of semiconductor light emitting elements 14.

Further, each of the pair of vertical surfaces 106c borders the adjacent reflecting surface 106b, and extends perpendicular to the first light emitting surface 14a and the mounting surface 102a at a position that is more distant from the optical wavelength conversion member 108 than the reflecting surface 106b. If the vertical surface 106c is formed as described above, it may be possible to make the reflecting member 106 be close to the second light emitting surface 14b of the semiconductor light emitting element 14 even between the pair of semiconductor light emitting elements 14 adjacent to each other and to suppress the formation of low-luminance portions between the reflecting member 106 and the semiconductor light emitting element 14.

The reflecting member 104 and the reflecting members 106 are integrally made of silicon. When the reflecting member 104 and the reflecting members 106 are manufactured, first, masking is formed on portions, which correspond to the upper surface 104a of the reflecting member 104 and the apexes of the reflecting members 106 where the pairs of reflecting surfaces 106b cross each other, of a flat plate-like substrate made of single-crystalline silicon. Then, wet etching is performed from the side of the substrate on which masking has been formed, so that the reflecting surfaces 104c and the reflecting surfaces 106b are formed. For this reason, the reflecting surface 104c and the reflecting surfaces 106b are inclined with respect to the upper surface 104a by an angle of about 54.7°. After the reflecting surfaces 104c and the reflecting surfaces 106b are formed, the masking is removed.

After the reflecting surfaces 104c and the reflecting surfaces 106b are formed, masking is formed on portions of the substrate that correspond to the lower surface 104b of the reflecting member 104 and the lower surfaces 106a of the reflecting members 106. Then, dry etching is performed at this time from the side of the substrate on which masking has been formed, so that the vertical surfaces 104d of the reflecting member 104 and the vertical surfaces 106c of the reflecting members 106 are formed. After the vertical surfaces 104d and the vertical surfaces 106c are formed, the masking is removed again.

Meanwhile, the height of the vertical surface 104d of the reflecting member 104 and the height of the vertical surface 106c of the reflecting member 106 are referred to as a vertical surface height H3. Similarly to the third embodiment, the reflecting member 104 and the reflecting members 106 are formed respectively in the fifth embodiment so that the vertical surface height H3 is equal to the non-light emitting region height H1.

Sixth Embodiment

FIG. 13A is a cross-sectional view of a light emitting module 120 according to a sixth embodiment and FIG. 13B is an enlarged view of the vicinity of a reflecting member 126 in FIG. 13A. Hereinafter, the same components as those of the above-mentioned embodiment are denoted by the same reference numerals and the description thereof will be omitted herein.

The light emitting module 120 includes a mounting substrate 122, semiconductor light emitting elements 14, a reflecting member 124, reflecting members 126, and an optical wavelength conversion member 128. The mounting substrate 122 is made of the same material as that of the mounting substrate 12 of the first embodiment in the shape of a plate. The sixth embodiment is the same as the fourth embodiment in that a plurality of semiconductor light emitting elements 14 are mounted in a line on a mounting surface 122a of the mounting substrate 122. However, as described below, the plurality of semiconductor light emitting elements 14 are mounted on the mounting surface 122a of the mounting substrate 122 with a distance, which is smaller than the distance between the semiconductor light emitting elements of the fourth embodiment, therebetween. For this reason, the entire length of the mounting substrate 122 or an electrode formed on the mounting surface 122a of the mounting substrate 122 is different from that of the mounting substrate 82.

The cross-sectional shape or material of the reflecting member 124 is the same as that of the reflecting member 18 of the first embodiment except that the reflecting member is formed to have a size large enough to surround the plurality of semiconductor light emitting elements 14. Further, the optical wavelength conversion member 128 is formed to have a size large enough to cover an opening of the reflecting member 124. Furthermore, the optical wavelength conversion member 128 is formed in the shape of a plate. The material of optical wavelength conversion member 128 is the same as that of the optical wavelength conversion member 20 of the first embodiment.

Accordingly, a lower surface 124b of the reflecting member 124 adheres to the mounting surface 122a, so that the reflecting member 124 is fixed to the mounting substrate 122. An adhesive used in this case is the same as described above, and a method of fixing the reflecting member 124 is not limited to adhesion, which is the same as described above. Further, an incident surface 128a of the optical wavelength conversion member 128 adheres to an upper surface 124a of the reflecting member 124, so that the optical wavelength conversion member 128 is fixed. In this case, the plurality of semiconductor light emitting elements 14 are arranged parallel to each other with a distance therebetween so that the respective first light emitting surfaces 14a face the incident surface 128a of a single optical wavelength conversion member 128.

Like the reflecting surfaces 84c of the fourth embodiment, reflecting surfaces 124c face the second light emitting surfaces 14b parallel to the arrangement direction of the semiconductor light emitting elements 14, among the respective second light emitting surfaces 14b of the plurality of semiconductor light emitting elements 14. Further, the reflecting surfaces 84c also face the respective outer second light emitting surfaces 14b of the semiconductor light emitting elements 14 that are positioned on both ends. The reflecting surfaces 124c are inclined to be separated from the second light emitting surfaces 14b facing the reflecting surfaces 124c as approaching the incident surface 128a of the optical wavelength conversion member 128. In other words, the reflecting surface 124c is inclined such that a distance between the reflecting surface 124c and the second light emitting surface 14b is gradually increased from the lower surface 124b to the upper surface 124a.

Even in the sixth embodiment, the reflecting member 126 is disposed between each pair of semiconductor light emitting elements 14 so that the pair of semiconductor light emitting elements 14 adjacent to each other is divided among the plurality of semiconductor light emitting elements 14. Because the plurality of semiconductor light emitting elements 14 are arranged in a line, the number of the reflecting members 126 is smaller than that of the semiconductor light emitting elements 14 by one, which is the same as described above. Meanwhile, even when the plurality of semiconductor light emitting elements 14 are arranged parallel to each other on a plane so as to form a plurality of lines, the reflecting member 126 is disposed between each pair of semiconductor light emitting elements 14 so that the pair of semiconductor light emitting elements 14 adjacent to each other is divided.

The reflecting member 126 is formed in the shape of a triangular prism. Among three side surfaces of the reflecting member 126, one side surface forms a lower surface 126a and the other two side surfaces form reflecting surfaces 126b. The lower surface 126a adheres to the mounting surface 122a, so that the reflecting member 126 is fixed to the mounting substrate 122. An adhesive used in this case is the same as described above, and a method of fixing the reflecting member 126 is not limited to adhesion, which is the same as described above.

In this way, the reflecting member 126 is disposed so that two reflecting surfaces 126b face the respective second light emitting surfaces 14b, which face each other, of the pair of semiconductor light emitting elements 14 adjacent to each other. Each of the pair of reflecting surfaces 126b is inclined to be separated from the second light emitting surface 14b facing the reflecting surface as approaching the incident surface 128a of the optical wavelength conversion member 128. Meanwhile, the reflecting surfaces 126b may be formed to face the second light emitting surfaces 14b of at least one of the pair of semiconductor light emitting elements 14.

In the sixth embodiment, the reflecting members 126 are formed so that the apexes of the reflecting members 126 where the pairs of reflecting surfaces 126b cross each other are separated from the incident surface 128a of the optical wavelength conversion member 128. Accordingly, it may be possible for the width of the lower surface 126a to be small and for the pair of semiconductor light emitting elements 14 adjacent to each other to be close to each other. Therefore, it may be possible to suppress the formation of low-luminance portions at a region between the pair of adjacent semiconductor light emitting elements 14. The reflecting member 126 is formed so that a distance H4 between the incident surface 128a of the optical wavelength conversion member 128 and the apex of the reflecting member 126 where the pair of reflecting surfaces 126b crosses each other is in the range of about 5 to 200 μm.

The reflecting member 124 and the reflecting members 126 are integrally made of silicon. When the reflecting member 124 and the reflecting members 126 are manufactured, first, masking is formed on a portion, which corresponds to the upper surface 124a of the reflecting member 124, of a flat plate-like substrate made of single-crystalline silicon. Then, wet etching is performed to a predetermined depth from the side of the substrate on which masking has been formed. After that, masking is formed on a portion that corresponds to the apexes of the reflecting members 126 where the pairs of reflecting surfaces 126b cross each other, and wet etching is performed again. Accordingly, the reflecting member 126 may be formed so that the apexes of the lower surface 126a are positioned at positions that are lower than the upper surface 124a of the reflecting member 124 by a predetermined depth. The reflecting surface 124c and the reflecting surfaces 126b are formed using wet etching in this way so as to be inclined with respect to the upper surface 124a by an angle of 54.7°. Those skilled in the art will appreciate that the reflecting member 124 and the reflecting members 126 may be made of a material other than silicon.

Seventh Embodiment

Figures 14A, 14B:
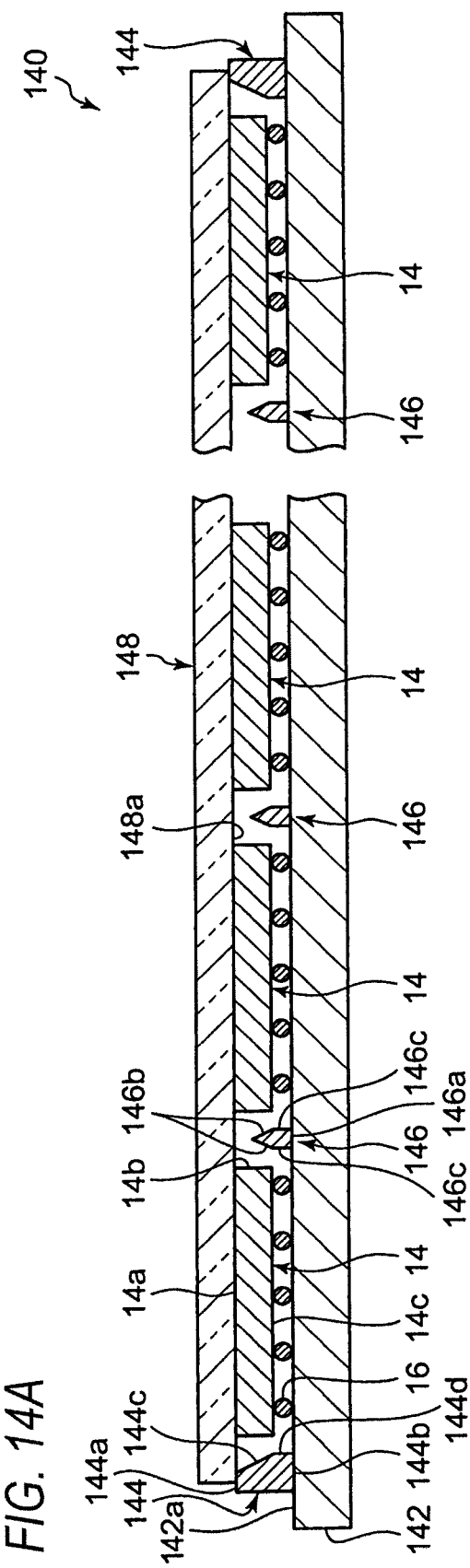
FIG. 14A is a cross-sectional view of a light emitting module according to a seventh embodiment of the invention.
FIG. 14B is an enlarged view of the vicinity of a reflecting member in FIG. 14A.

FIG. 14A is a cross-sectional view of a light emitting module 140 according to a seventh embodiment and FIG. 14B is an enlarged view of the vicinity of a reflecting member 146 in FIG. 14A. Hereinafter, the same components as those of the above-mentioned embodiment are denoted by the same reference numerals and the description thereof will be omitted herein.

The light emitting module 140 includes a mounting substrate 142, semiconductor light emitting elements 14, a reflecting member 144, reflecting members 146, and an optical wavelength conversion member 148. The mounting substrate 142 is made of the same material as that of the mounting substrate 12 of the first embodiment in the shape of a plate. The seventh embodiment is the same as the fourth embodiment in that a plurality of semiconductor light emitting elements 14 are mounted in a line on a mounting surface 142a of the mounting substrate 142. However, as described below, the plurality of semiconductor light emitting elements 14 are mounted on the mounting surface 142a of the mounting substrate 142 with a distance, which is smaller than the distance between the semiconductor light emitting elements 14 of the fourth embodiment, therebetween. For this reason, the entire length of the mounting substrate 142 or an electrode formed on the mounting surface 142a of the mounting substrate 142 is different from that of the mounting substrate 82.

The cross-sectional shape or material of the reflecting member 144 is the same as that of the reflecting member 62 of the third embodiment except that the reflecting member 144 is formed to have a size large enough to surround the plurality of semiconductor light emitting elements 14. The optical wavelength conversion member 148 is formed in the shape of a plate that has a size large enough to cover an opening of the reflecting member 144. The material of the optical wavelength conversion member 148 is the same as that of the optical wavelength conversion member 20 of the first embodiment.

Accordingly, a lower surface 144b of the reflecting member 144 adheres to the mounting surface 142a, so that the reflecting member 144 is fixed to the mounting substrate 142. An adhesive used in this case is the same as described above, and a method of fixing the reflecting member 144 is not limited to adhesion, which is the same as described above. Further, an incident surface 148a of the optical wavelength conversion member 148 adheres to an upper surface 144a of the reflecting member 144, so that the reflecting member 144 is fixed. In this case, the plurality of semiconductor light emitting elements 14 are arranged parallel to each other with a distance therebetween so that the respective first light emitting surfaces 14a face the incident surface 148a of a single optical wavelength conversion member 148. Like the reflecting surfaces 84c of the fourth embodiment, reflecting surfaces 144c face the second light emitting surfaces 14b parallel to the arrangement direction of the semiconductor light emitting elements 14, among the respective second light emitting surface 14b of the plurality of semiconductor light emitting elements 14. Further, the reflecting surfaces 144c also face the respective outer second light emitting surfaces 14b of the semiconductor light emitting elements 14 that are positioned on both ends.

The reflecting surfaces 144c are inclined to be separated from the second light emitting surfaces 14b facing the reflecting surfaces 144c as approaching the incident surface 148a of the optical wavelength conversion member 148. In other words, the reflecting surface 144c is inclined such that a distance between the reflecting surface 144c and the second light emitting surface 14b is gradually increased from the lower surface 144b to the upper surface 144a. Further, even in the seventh embodiment, the reflecting member 146 is disposed between each pair of semiconductor light emitting elements 14 so that the pair of semiconductor light emitting elements 14 adjacent to each other is divided among the plurality of semiconductor light emitting elements 14. Because the plurality of semiconductor light emitting elements 14 are arranged in a line, the number of the reflecting members 146 is smaller than that of the semiconductor light emitting elements 14 by one, which is the same as described above. Meanwhile, even when the plurality of semiconductor light emitting elements 14 are arranged parallel to each other on a plane so as to form a plurality of lines, the reflecting member 146 is disposed between each pair of semiconductor light emitting elements 14 so that the pair of semiconductor light emitting elements 14 adjacent to each other is divided.

In the seventh embodiment, the reflecting member 146 is formed in the shape of a pentagonal prism. Five side surfaces of the pentagonal prism include a lower surface 146a, a pair of vertical surfaces 146c bordering the lower surface 146a so as to be perpendicular to the lower surface, and a pair of reflecting surfaces 146b inclined with respect to the pair of vertical surfaces 146c at the same angle. The lower surface 146a adheres to the mounting surface 142a, so that the reflecting member 146 is fixed to the mounting substrate 142. An adhesive used in this case is the same as described above, and a method of fixing the reflecting member 146 is not limited to adhesion, which is the same as described above.

In this case, the pair of reflecting surfaces 146b faces the respective second light emitting surfaces 14b, which face each other, of the pair of semiconductor light emitting elements 14 adjacent to each other. Meanwhile, the reflecting surfaces 146b may be formed to face the second light emitting surfaces 14b of at least one of the pair of semiconductor light emitting elements 14.

Further, each of the pair of vertical surfaces 146c borders the adjacent reflecting surface 146b, and extends perpendicular to both the first light emitting surface 14a and the mounting surface 142a at a position that is more distant from the optical wavelength conversion member 148 than the reflecting surface 146b. If the vertical surface 146c is formed as described above, it may be possible for the reflecting member 146 to be close to the second light emitting surface 14b of the semiconductor light emitting element 14 even between the pair of semiconductor light emitting elements 14 adjacent to each other and for the formation of low-luminance portions between the reflecting member 146 and the semiconductor light emitting element 14 to be suppressed.

In the seventh embodiment, the reflecting members 146 are formed so that the apexes of the reflecting members 146 where the pairs of reflecting surfaces 146b cross each other are separated from the incident surface 148a of the optical wavelength conversion member 148. The reflecting member 146 is formed so that a distance H5 between the incident surface 148a of the optical wavelength conversion member 148 and the apex of the reflecting member where the pair of reflecting surfaces 146b crosses each other is in the range of about 5 to 200 μm.

The reflecting member 144 and the reflecting members 146 are integrally made of silicon. When the reflecting member 144 and the reflecting members 146 are manufactured, first, the reflecting surfaces 144c and the reflecting surfaces 146b are formed on a flat plate-like substrate made of single-crystalline silicon by the same method as the method of forming the reflecting surfaces 124c and the reflecting surfaces 126b of the sixth embodiment. After the reflecting surfaces 144c and the reflecting surfaces 146b are formed, masking is formed on portions of the substrate that correspond to the lower surface 144b of the reflecting member 144 and the lower surfaces 146a of the reflecting members 146. Then, dry etching is performed at this time from the side of the substrate on which masking has been formed, so that the vertical surfaces 144d of the reflecting member 144 and the vertical surfaces 146c of the reflecting members 146 are formed. After the vertical surfaces 144d and the vertical surfaces 146c are formed, the masking is removed again.

Meanwhile, the height of the vertical surface 144d of the reflecting member 144 and the height of the vertical surface 146c of the reflecting member 146 are referred to as a vertical surface height H6. Similarly to the third embodiment, the reflecting member 144 and the reflecting members 146 are formed respectively in the seventh embodiment so that the vertical surface height H6 is equal to the non-light emitting region height H1.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

In a certain modification, a light emitting element, which mainly emits ultraviolet light, may be used as a semiconductor light emitting element. Further, an optical wavelength conversion member is formed by stacking a plurality of optical wavelength conversion layers that converts ultraviolet light into light having different colors. For example, an optical wavelength conversion member may be formed by stacking an optical wavelength conversion layer that converts ultraviolet light into blue light, and an optical wavelength conversion layer that converts ultraviolet light into yellow light. Alternatively, an optical wavelength conversion member may be formed by stacking an optical wavelength conversion layer that converts ultraviolet light into blue light, an optical wavelength conversion layer that converts ultraviolet light into green light, and an optical wavelength conversion layer that converts ultraviolet light into red light. It may also be possible to obtain a light emitting module, which emits white light, by forming the semiconductor light emitting element and the optical wavelength conversion member as described above.

Meanwhile, several kinds of phosphors that convert ultraviolet light into light having different colors may be contained in the optical wavelength conversion member. For example, a phosphor that converts ultraviolet light into blue light, and a phosphor that converts ultraviolet light into yellow light may be contained in the optical wavelength conversion member. Alternatively, a phosphor that converts ultraviolet light into blue light, a phosphor that converts ultraviolet light into green light, and a phosphor that converts ultraviolet light into red light may be contained in the optical wavelength conversion member. It may also be possible to obtain a light emitting module, which emits white light, by forming the semiconductor light emitting element and the optical wavelength conversion member as described above.

In another modification, a region, which is surrounded by a second light emitting surface of a semiconductor light emitting element, reflecting surfaces of reflecting members, and an incident surface of an optical wavelength conversion member, is filled with a resin material that increases the extraction efficiency of light emitted from the second light emitting surface of the semiconductor light emitting element. In this case, a resin material, such as a silicone-based resin material, a sol-gel silica-based resin material, a fluorine-based resin material, or an inorganic glass-based resin material, which is excellent in light resistance, is used. Accordingly, it may be possible to further improve the extraction efficiency of light emitted from the second light emitting surface of the semiconductor light emitting element.

The invention claimed is:

1. A light emitting module comprising:
   a plurality of light emitting elements, each of the light emitting elements comprising:
      a first light emitting surface, and second light emitting surfaces bordering the first light emitting surface;
   an optical wavelength conversion member that converts a wavelength of light emitted from the light emitting elements, wherein the optical wavelength conversion member is plate-shaped and is disposed such that an incident surface of the optical wavelength conversion member faces the first light emitting surfaces; and
   a plurality of reflecting members, each of the reflecting members disposed to face the incident surface of the optical wavelength conversion member, and comprising a reflecting surface,
   wherein each of the reflecting surfaces faces the second light emitting surfaces,
   wherein each of the reflecting surfaces is inclined such that a distance between each of the reflecting surfaces and the second light emitting surfaces is gradually increased toward the incident surface of the optical wavelength conversion member,
   wherein the optical wavelength conversion member contacts the first light emitting surfaces,
   wherein the plurality of the light emitting elements are arranged with a distance interposed therebetween such that the respective first light emitting surfaces face the incident surface of the optical wavelength conversion member,
   wherein the plurality of reflecting members are disposed so as to surround each of the light emitting elements and so as to separate the light emitting elements adjacent to each other, and
   wherein the reflecting surface of each of the reflecting members respectively faces the second light emitting surfaces of each of the light emitting elements.

2. The light emitting module according to claim 1, wherein each of the reflecting members is made of silicon.

3. The light emitting module according to claim 1, wherein the optical wavelength conversion member is disposed such that the incident surface of the optical wavelength conversion member contacts the reflecting members.

4. The light emitting module according to claim 1, wherein a gap is provided between each of the reflecting members and the incident surface of the optical wavelength conversion member.

5. The light emitting module according to claim 1,
   wherein each of the reflecting members is triangular in cross-section, and
   wherein an apex of the triangular reflecting member contacts a bottom surface of the optical wavelength conversion member.

6. The light emitting module according to claim 1, further comprising:
   a mounting substrate comprising a first surface,
   wherein the light emitting elements and the reflecting members are directly disposed on the first surface of the mounting substrate.

7. The light emitting module according to claim 1,
   wherein at least one of the plurality of the reflecting members further comprises:
      a vertical surface that borders the reflecting surface and extends in a direction substantially perpendicular to the first light emitting surface such that the optical wavelength conversion member is closer to the reflecting surface than the vertical surface.

8. The light emitting module according to claim 7, wherein the optical wavelength conversion member is disposed such that the incident surface of the optical wavelength conversion member contacts at least one of the plurality of the reflecting members.

9. The light emitting module according to claim 7, wherein a gap is provided between at least one of the plurality of the reflecting members and the incident surface of the optical wavelength conversion member.

10. The light emitting module according to claim 1,
    wherein each of the reflecting members further comprises:
       a vertical surface that borders the reflecting surface and extends in a direction substantially perpendicular to the first light emitting surface such that the optical wavelength conversion member is closer to the reflecting surface than the vertical surface.

11. The light emitting module according to claim 10, wherein the optical wavelength conversion member is disposed such that the incident surface of the optical wavelength conversion member contacts each of the reflecting members.

12. The light emitting module according to claim 10, further comprising:
    a mounting substrate comprising a first surface,
    wherein the light emitting elements and the reflecting members are disposed on the first surface of the mounting substrate.

13. The light emitting module according to claim 12,
    wherein each of the light emitting elements further comprises: a back surface opposite to the first light emitting surface and faces the first surface of the mounting substrate, and
    wherein a distance between the back surface of the light emitting element and the first surface of the mounting substrate is substantially equal to the height of the vertical surface of the reflecting member in the direction substantially perpendicular to the first light emitting surface.

14. The light emitting module according to claim 13, wherein a plurality of bumps are provided on the back surface of each of the light emitting elements.

* * * * *